(12) United States Patent
Ni et al.

(10) Patent No.: US 7,105,102 B2
(45) Date of Patent: Sep. 12, 2006

(54) VACUUM PLASMA PROCESSOR HAVING A CHAMBER WITH ELECTRODES AND A COIL FOR PLASMA EXCITATION AND METHOD OF OPERATING SAME

(75) Inventors: Tuqiang Ni, Fremont, CA (US); Wenli Collison, Fremont, CA (US); David Hemker, San Jose, CA (US); Lumin Li, Santa Clara, CA (US)

(73) Assignee: LAM Research Corporation, Fremont, CA (US)

( * ) Notice: Subject to any disclaimer, the term of this patent is extended or adjusted under 35 U.S.C. 154(b) by 59 days.

(21) Appl. No.: 10/769,878

(22) Filed: Feb. 3, 2004

(65) Prior Publication Data

US 2004/0154747 A1  Aug. 12, 2004

Related U.S. Application Data

(62) Division of application No. 09/689,616, filed on Oct. 13, 2000, now Pat. No. 6,716,303.

(51) Int. Cl.
*H01L 21/00* (2006.01)

(52) U.S. Cl. .................. 216/67; 134/1.1; 134/22.1; 438/710

(58) Field of Classification Search .................. 216/67; 134/1.1, 22.1
See application file for complete search history.

(56) References Cited

U.S. PATENT DOCUMENTS 5,795,429 A    8/1998  Ishii et al.
5,811,357 A *  9/1998  Armacost et al. ............ 438/723
5,989,929 A * 11/1999  Nikoh et al. ..................... 438/9
6,077,384 A    6/2000  Collins et al.
6,101,970 A    8/2000  Koshimizu
6,461,974 B1* 10/2002  Ni et al. ........................ 438/712
6,699,399 B1*  3/2004  Qian et al. ..................... 216/67
2001/0004552 A1*  6/2001  Tang et al. .................. 438/689
2002/0092826 A1*  7/2002  Ding ............................ 216/67
2003/0036287 A1*  2/2003  Ding et al. .................. 438/723

FOREIGN PATENT DOCUMENTS

WO       97/08734      3/1997
WO    WO-9934399      7/1999

* cited by examiner

*Primary Examiner*—Allan Olsen
(74) *Attorney, Agent, or Firm*—Lowe, Hauptman & Berner LLP

(57) ABSTRACT

A vacuum plasma processor includes a roof structure including a dielectric window carrying (1) a semiconductor plate having a high electric conductivity so it functions as an electrode, (2) a hollow coil and (3) at least one electric shield. The shield, coil and semiconductor plate are positioned to prevent substantial coil generated electric field components from being incident on the semiconductor plate. During a first interval the coil produces an RF electromagnetic field that results in a plasma that strips photoresist from a semiconductor wafer. During a second interval the semiconductor plate and another electrode produce an RF electromagnetic field that results in a plasma that etches electric layers, underlayers and photoresist layers from the wafer.

7 Claims, 14 Drawing Sheets

VACUUM PLASMA PROCESSOR HAVING A CHAMBER WITH ELECTRODES AND A COIL FOR PLASMA EXCITATION AND METHOD OF OPERATING SAME

This application is a divisional of U.S. application Ser. No. 09/689,616 filed Oct. 13, 2000, which issued as U.S. Pat. No. 6,716,303 on Apr. 6, 2004.

FIELD OF THE INVENTION

The present invention relates generally to vacuum plasma processors using a coil and electrodes for establishing plasmas in a single processing chamber and, more particularly, to such a processor wherein the chamber includes a coil, a semiconductor electrode and a non-magnetic metal member arranged to prevent substantial electric field components the coil generates from being coupled to the semiconductor electrode. The invention also relates to a method of operating a vacuum plasma processor including a semiconductor electrode and a coil wherein fields derived from the electrode and coil establish plasmas with sufficient power to remove materials from a workpiece.

BACKGROUND ART

Vacuum plasma processors for processing workpieces, such as semiconductor wafers, dielectric plates and metal plates, frequently employ coils or electrodes to establish RF electromagnetic fields for exciting gases in vacuum processing chambers to an RF plasma. The coil excitation is frequently referred to as inductive, while the electrode excitation is frequently referred to as capacitive.

The capacitively and inductively coupled vacuum plasma processors are frequently employed to etch dielectric material from a semiconductor workpiece including an underlayer and a photoresist layer. The capacitive processors have an advantage over the inductive processors because the capacitive processors cause lower damage and have higher selectivity to the underlayer and photoresist layer. The inductive processors have an advantage over the capacitive processors because the inductive processors etch workpieces at a higher rate than the capacitive processors. The inductive processors have a higher oxygen dissociation rate to enable chambers to be cleaned more rapidly than can be attained by the capacitive processors.

Hybrid processors having both capacitive and inductive RF plasma excitation have been recently introduced to perform various etch applications in the capacitive mode and efficient photoresist stripping and chamber cleaning in the inductive mode. The hybrid processors can increase processing throughput and reduce processing costs because the same chamber can be used for multiple purposes without opening the chamber or moving the workpiece from chamber to chamber to perform different processes.

Collins et al., U.S. Pat. No. 6,077,384, and WO 97/08734 disclose prior art vacuum plasma processors including both inductive and capacitive coupling wherein a ceiling of a vacuum plasma processor chamber includes a high resistivity (e.g., 30 ohm-cm, i.e., a conductivity of 0.03 mho per cm, at room temperature) semiconductor window. The semiconductor window is between the processing chamber and an insulating structure carrying a flat or domed coil. The window extends from a central longitudinal axis of the chamber to a peripheral wall of the chamber. The semiconductor window must have high resistivity, i.e., low conductivity, to prevent substantial power dissipation in the semiconductor window. If the semiconductor window has a high conductivity, the electric field component of the coil electromagnetic field dissipates substantial power in the semiconductor so power necessary to achieve plasma ignition is not coupled to the gas. Collins et al. specifically states that if the semiconductor window has a high conductivity, such as a resistivity of 0.01 ohms-cms, i.e., a conductivity of 100 mhos/cm, the frequency of the RF induction field from the coil would have to be reduced to the kilohertz range or below to couple the field the coil generates through the semiconductor window.

Collins et al. discloses a grounded non-magnetic metal Faraday shield and/or a powered or grounded non-magnetic metal backplane interposed between the semiconductor window and the coil. The non-magnetic metal backplane and Faraday shield include openings between turns of the coil and the semiconductor window so that the electric field component from the coil is coupled to the semiconductor window that extends continuously, in unbroken fashion, from the chamber center longitudinal axis to the chamber peripheral wall. The electric field components from the coil coupled through the Faraday shield and/or backplane have the same effect on the semiconductor window in the embodiments of FIGS. 25A and 37A of Collins et al. as in the embodiment of FIG. 1 of Collins et al., necessitating the use of a low conductivity semiconductor window in the embodiments of FIGS. 25A and 37A.

The semiconductor window, the backplane and Faraday shield are all made of non-magnetic material to couple the coil magnetic field components to the gas in the chamber to excite and/or maintain the gas in a plasma state. The non-magnetic metal backplane and Faraday shield openings in the backplane and Faraday shield reduce eddy current losses that occur in response to the magnetic field components.

The Collins et al. low conductivity semiconductor window has the disadvantage of applying a relatively low magnitude electromagnetic field to the plasma when the processor is operated in the capacitive mode. This is because the low conductivity silicon window does not have a high degree of electric field coupling to the plasma. Collins et al. state the semiconductor window is used for fluorine and polymerization scavenging from the plasma. The vast majority of the electromagnetic field etching which the Collins et al. device provides results from applying RF to an electrode on a chuck for the workpiece being processed.

It is, accordingly, an object of the present invention to provide a new and improved vacuum plasma processor apparatus and method for selectively, at different times, coupling plasma excitation electromagnetic fields derived from inductive and capacitive sources to gas in a single vacuum plasma processing chamber.

Another object of the invention is to provide a new and improved vacuum plasma processor apparatus and method wherein a single vacuum plasma processing chamber can efficiently perform many different processing steps and can be cleaned without being opened.

A further object of the invention is to provide a new and improved vacuum plasma processor apparatus and method wherein a vacuum plasma processing chamber can be operated to provide relatively high processing throughput, to reduce the cost of workpiece fabrication.

An additional object of the invention is to provide a new and improved vacuum plasma processor apparatus and method wherein a vacuum plasma processing chamber can be selectively operated to enable workpieces to be processed (1) during certain time periods at relatively high speeds and (2) at other times so workpiece damage is minimized, while providing high selectivity to underlayers and photoresist layers of wafers being processed.

Still another object of the invention is to provide a new and improved vacuum plasma processor including a chamber with a semiconductor plasma excitation electrode in close proximity to a plasma excitation coil, wherein the semiconductor electrode has a high enough conductivity to establish RF processing plasmas having sufficient field strength to process, in particular, etch, workpieces in the chamber.

Yet another object of the invention is to provide a new and improved vacuum plasma processor with a chamber including inductive and capacitive plasma excitation, wherein a semiconductor electrode, having high enough conductivity to establish an electromagnetic field of sufficient strength to process and, in particular, to etch a workpiece, is in proximity to a coil, but does not interact with electric field components of the electromagnetic field the coil generates and which are coupled to gas in the chamber.

SUMMARY OF THE INVENTION

In accordance with one aspect of the invention, a vacuum plasma processor for processing workpieces comprises a vacuum chamber having an electrode arrangement, including a semiconductor member, for ionizing gas in the chamber to a plasma. A coil outside the chamber generates an electromagnetic field for ionizing gas in the chamber to a plasma. A non-magnetic metal arrangement is interposed between the coil and the semiconductor member. The coil, non-magnetic metal arrangement and semiconductor member are positioned and arranged to prevent substantial electric field components of the electromagnetic field from being incident on the semiconductor member while enabling substantial electric and magnetic field components from the coil to be incident on the gas so the gas is ionized.

Another aspect of the invention relates to a vacuum plasma processor for processing workpieces that comprises a vacuum chamber having an electrode arrangement, including a semiconductor member, for ionizing gas in the chamber to a plasma. A coil outside the chamber generates an electromagnetic field for ionizing gas in the chamber to a plasma. A non-magnetic metal arrangement is interposed between the coil and the semiconductor member. The coil, non-magnetic metal arrangement and semiconductor member are positioned and arranged so (1) no portion of the semiconductor member is outside the interior of an inner turn of the coil, and (2) the non-magnetic metal arrangement includes a member having a periphery approximately aligned with the interior of the coil inner turn.

In first and second embodiments, the non-magnetic metal arrangement includes a member that is spaced from the semiconductor member and abuts the semiconductor member. In a third embodiment, the non-magnetic metal arrangement includes a first member abutting or adjacent the semiconductor member and a second member spaced from the semiconductor member.

The dielectric window, semiconductor member, and non-magnetic metal arrangement are preferably in a roof structure of the chamber. The coil has an interior portion that is spaced from a chamber center portion so peripheral portions of the semiconductor member are inside or approximately aligned with the coil interior portion. The non-magnetic metal arrangement has peripheral portions spaced from the chamber center portion by approximately the same distance as the semiconductor member peripheral portions. When the non-magnetic metal arrangement includes first and second members respectively abutting and spaced from the semiconductor member, the first non-magnetic metal member has a periphery slightly outside the periphery of the semiconductor member and the first and second non-magnetic metal members have approximately aligned peripheries.

In one preferred embodiment, particularly adapted for use with circular workpieces, e.g., semiconductor wafers, the chamber has a circular interior wall having a first diameter and the non-magnetic metal arrangement includes a member having a circular periphery having a second diameter, while the semiconductor member has a circular periphery having a third diameter. The chamber interior wall, the non-magnetic metal member and the semiconductor member are co-axial. The first diameter is greater than the second diameter, and the second diameter is approximately equal to the third diameter. The coil is substantially co-axial with the chamber interior wall and has a substantially circular innermost turn having a diameter approximately equal to the third diameter. When the non-magnetic metal member abuts or is adjacent the semiconductor member, the second diameter is slightly greater than the third diameter. When the non-magnetic metal member is adjacent the coil, it has a diameter slightly less than the interior diameter of the coil innermost turn. When the non-magnetic metal arrangement includes first and second circular members co-axial with the chamber interior wall and the first circular member abuts or is adjacent the semiconductor member and the second circular member is adjacent the coil, the second diameter is slightly greater than the third diameter and the second circular member has a diameter slightly less than the interior diameter of the coil innermost turn.

In the preferred embodiments, the semiconductor member is a flat plate while the non-magnetic metal member(s) can be flat plates or flat rings.

The semiconductor member has a high electric conductivity, e.g., no less than 0.01 mho/cm, and preferably at least 0.1 or 1.0 mho/cm so the semiconductor member can function as an efficient electrode to produce RF electromagnetic fields that supply sufficient power to the plasma to enable the plasma to remove materials from the workpiece.

A further aspect of the invention concerns a method of removing material from a workpiece in a vacuum plasma processing chamber including first and second spaced plasma excitation electrodes, one of which includes a semiconductor interposed between a plasma excitation coil and gas in the chamber. The method comprises removing the material during a first interval by energizing the coil so it supplies an RF ionizing electromagnetic field to the gas. The RF ionizing electromagnetic field has magnetic field components that are coupled through the semiconductor to the gas and electric field components that are coupled to the gas without being intercepted by the semiconductor. The electromagnetic field has sufficient power to cause a plasma resulting from the gas to be sufficiently energetic to etch the material. The material is removed during a second interval by energizing the electrodes so they supply an RF ionizing electromagnetic field to the gas. The RF ionizing electromagnetic field is coupled between the electrodes to the gas and material.

To maximize wafer processing throughput, the chamber is preferably maintained in a vacuum state between the first and second intervals and the chamber is cleaned during a third interval by energizing the coil so it supplies an RF ionizing electromagnetic field to the gas. The electromagnetic field derived during the third interval has sufficient power to cause a plasma resulting from the gas to be sufficiently energetic to etch material deposited on interior surfaces of the chamber. The chamber is maintained in the vacuum state during the third interval, and between the first and third intervals, and between second and third intervals. The material can be a dielectric layer or a photoresist layer that is etched during the second interval or photoresist that is stripped from the workpiece during the first interval.

The above and still further objects, features and advantages of the present invention will become apparent upon consideration of the following detailed descriptions of several specific embodiments thereof, especially when taken in conjunction with the accompanying drawings.

DETAILED DESCRIPTION OF THE DRAWINGS

Figure 1A:
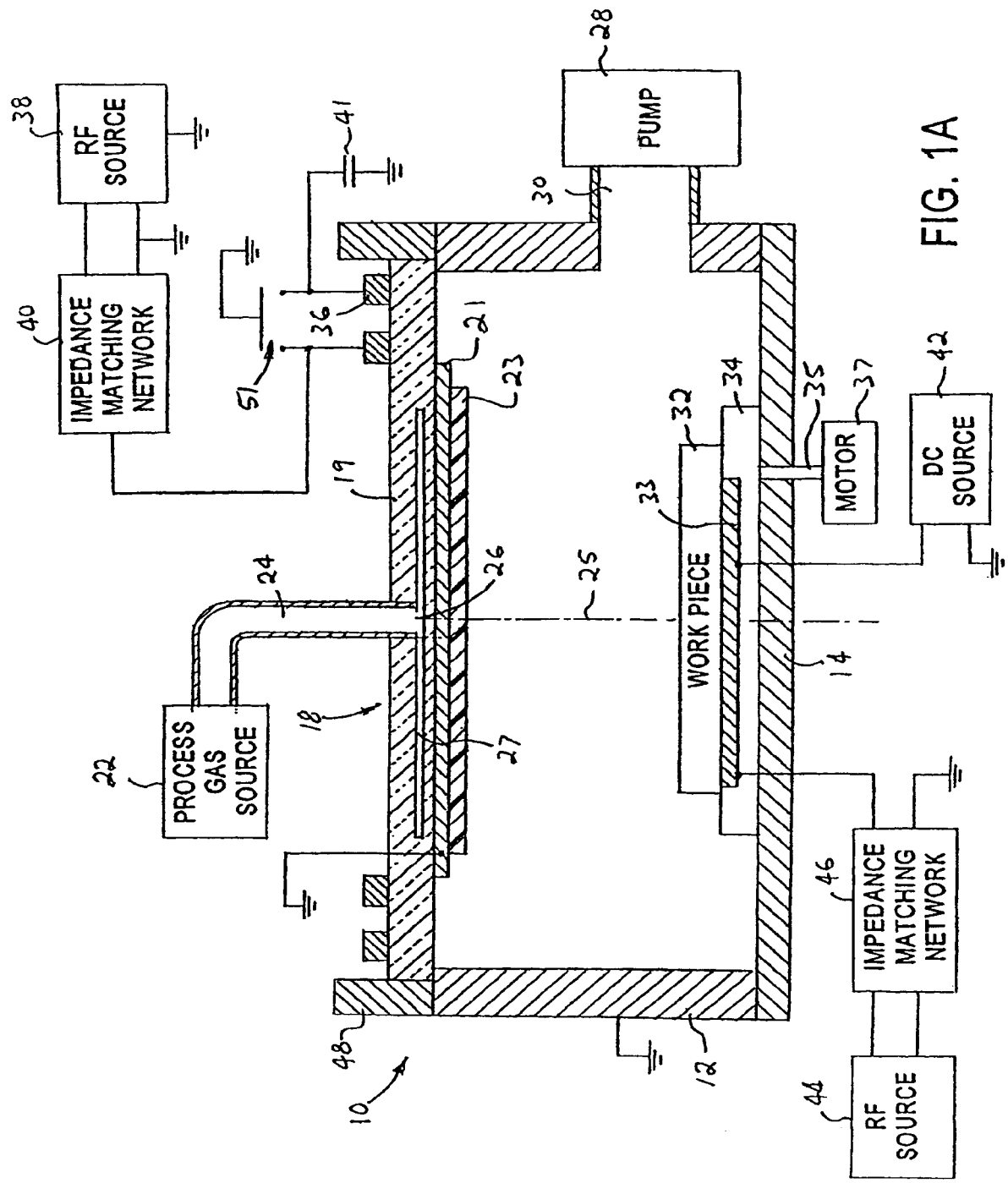
FIG. 1A is a partially schematic diagram including a side sectional view of a vacuum plasma processing chamber including a coil and electrode arrangement in accordance with one embodiment of the present invention.

The vacuum plasma workpiece processor of FIG. 1A includes vacuum chamber 10, shaped as a cylinder including grounded metal wall 12 having a circular interior surface, metal base plate 14, and circular roof structure 18, including horizontal dielectric (preferably silicon carbide) window 19 that carries circular non-magnetic metal (e.g., copper or aluminum) electric shield plate or layer 21 that abuts a semiconductor member formed as circular plate 23. Semiconductor plate 23 is located inside chamber 10 so it is exposed to the plasma in the chamber to a much greater extent than metal plate 21 because the semiconductor plate covers a substantial part of the metal plate. Plates 21 and 23 are continuous, i.e., have no gaps between the center and periphery thereof, except for gas distribution holes and/or channels.

Dielectric window 19 usually has the same thickness from its center to its periphery and a diameter exceeding the inner diameter of wall 12 so the window peripheral portion bears against the top edge of wall 12. Gaskets (not shown) seal vacuum chamber 10 in a conventional manner. The processor of FIG. 1A is typically used for etching a workpiece, usually in the form of a circular semiconductor wafer, frequently referred to as a substrate, or for depositing molecules on such a workpiece.

Workpiece 32 is fixedly mounted in chamber 10 to a flat horizontal surface of workpiece holder, i.e., chuck or platen, 34. Chuck 34, typically of the electrostatic type, clamps workpiece 32 in place by virtue of DC power supply 42 applying a DC potential to electrode 33 on the chuck upper face. The interior surface of wall 12, window 19, and each of plates 21 and 23, workpiece 32 and chuck 34 are concentric with center, vertically extending longitudinal axis 25 of chamber 10. Vacuum pump 28, connected to port 30 in wall 12 or via a manifold to ports in base 14, maintains the interior of chamber 10 in a vacuum condition, at a pressure that can vary in the range of about 1–1000 millitorr.

A suitable processing or chamber cleaning etchant gas that is excited to an RF plasma is supplied to the interior of chamber 10 from gas source 12 via line 24 and port 26 in the center of window 19, as well as via distribution conduit 27 in window 19 and distribution holes (not shown) in plates 21 and 23. Plasma excitation of the gas supplied to the interior of chamber 10 can be in response to an RF electromagnetic field inductively coupled to the gas in the chamber by coil 36 or in response to RF electromagnetic fields capacitively coupled by plate 23 and the electrodes of chuck 34 to the gas in the chamber.

The inductively or capacitively coupled RF field excites the gas in chamber 10 to an RF plasma that processes (e.g., etches) workpiece 32 or cleans the chamber interior. The RF electromagnetic field from coil 36 is used for high etch rate processes and chamber cleaning because it has a higher oxygen dissociation rate than the electromagnetic fields produced between plate 23 and chuck 34. The electromagnetic field plasma excitation from plate 23 causes lower workpiece damage, as well as higher selectivity to underlayers and photoresist layers on the workpieces, than the electromagnetic field excitation. In addition, the electromagnetic field excitation produced between plate 23 and chuck 34 often provides more uniform etching across the workpiece.

Because the gas in chamber 10 can be inductively or capacitively excited to a plasma at different times, the same chamber at different times can (1) etch a dielectric layer or a photoresist layer from workpiece 32 with the capacitively excited plasma and (2) strip photoresist from the same workpiece with the inductively excited plasma. These two operations can be performed without opening the chamber or moving the workpiece between chambers. In addition, the chamber can be cleaned between workpiece processing operations with the inductively excited plasma without opening the chamber. Consequently, chamber 10 has increased workpiece throughput and reduced workpiece processing costs relative to prior art processors.

The RF electromagnetic field source includes two turn, hollow, spiral, substantially planar metal coil 36, similar to the coil disclosed by Ogle, U.S. Pat. No. 4,948,458. Coil 36 is typically made of square copper tubing having a hollow interior. It is to be understood that coil 36 is not necessarily planar and can have other shapes, e.g., a dome, and that the coil does not have to be hollow. Coil 36 is mounted on or immediately above window 19 and excited by RF power source 38, usually having a fixed frequency of 13.56 MHz and a fixed amplitude envelope. Alternatively, if plate 23 is driven by an RF source, e.g., a source having a frequency of 27 MHz, the same source, through a switching arrangement (not shown), can drive coil 36 when the source is not driving plate 23. The current in coil 36 generates a large enough electromagnetic field, including electric field components and magnetic field components, in chamber 10, to excite gas in the chamber to a plasma. Coil 36 has a length that is a substantial fraction of a wavelength of the frequency of source 38, so there are substantial voltage and current variations along the coil length. The voltage variations are sufficient to enable substantial RF voltage differences to be established between adjacent portions of the two turns, e.g., along the same radius of the coil. The voltage differences between adjacent radial portions of the two turns establish substantial RF electric field components in the chamber portions below the two turns of the coil. The RF electric fields ionize gas in chamber 10 to a plasma. The coil magnetic field components include magnetic lines of flux that extend into chamber 10 parallel to chamber axis 25. The magnetic lines of flux that are parallel to axis 25 penetrate plates 21 and 23 in the center portion of chamber 10 and continue around the chamber beyond the periphery of plates 21 and 23.

Impedance matching network 40, connected between an output terminal of RF source 38 and excitation terminals of coil 36, couples the output of the RF source to the coil, such that one end terminal of the coil is connected to an ungrounded output terminal of network 40 and the other terminal of the coil is connected to one electrode of capacitor 41, the other electrode of which is grounded. Impedance matching network 40 includes variable reactances (not shown), which a controller (not shown) varies in a known manner to achieve impedance matching between source 38 and a load including coil 36 in the plasma the coil drives.

Electrode 33 of chuck 34 is excited by RF power source 44 supplying an RF voltage to impedance matching network 46, including variable reactances (not shown). Typically, source 44 generates a fixed amplitude 2 MHz wave that is superimposed on a 27 MHz fixed amplitude wave. Matching network 46 couples the output of source 44 to electrode 33. The previously mentioned controller controls the variable reactances of matching network 46 to match the impedance of source 44 to the load impedance coupled to electrode 33. The load coupled to electrode 33 is primarily plasma in chamber 10. As is well known, the RF energy that source 44 applies to electrode 33 interacts with the charged particles in the plasma to produce a DC bias on workpiece 32.

Semiconductor plate 23 can be grounded, as shown, or driven by a fixed amplitude 27 MHz voltage via a matching network (not shown). If plate 23 is driven by a 27 MHz voltage, the RF excitation for electrode 33 of chuck 34 is provided only by a 2 MHz voltage.

Metal plate 21 is connected to ground or a source of the 27 MHz voltage to distribute the ground or RF voltage to semiconductor plate 23, which electrically and mechanically contacts plate 21. Metal plate 21 can also float, i.e., be connected to no voltage source terminal, in which case semiconductor plate 23 also floats and is decoupled from a power supply terminal.

When chamber 10 operates in the inductive plasma excitation mode, i.e., coil 36 is energized, sources 38 and 44 are energized and metal plate 21 is grounded, connected to a non-zero volt AC or DC power supply terminal, or floats. When chamber 10 operates in the capacitive plasma excitation mode, ground or voltage at a frequency of 27 MHz is applied to metal plate 21, and source 44 remains energized, but source 38 is de-energized while switch 51 connects the opposite terminals of coil 36 together and to ground. Hence, coil 36 cannot produce an electromagnetic field and has no influence on the electromagnetic field between semiconductor plate 23 and the electrodes in chuck 34 when chamber 10 operates in the capacitive plasma excitation mode. In both modes, sources 42 and 44 drive electrode 33 of chuck 34.

To provide optimum processing of workpiece 32, e.g., to obtain maximum etch uniformity and a desired etch profile on the workpiece under the many processing circumstances encountered in both the capacitive and inductive plasma excitation modes, the distance between workpiece 32 and semiconductor plate 23, as well as coil 36, can be varied. To this end, output shaft 35 of motor 37 sealingly extends through base 14 and is drivingly connected to chuck 34 to translate the chuck and workpiece 32 clamped to the chuck up and down, toward and away from roof 18 and the fixed structures forming the roof.

Semiconductor plate 23 has an electrical conductivity of at least 0.01 mho/cm, a result which can be achieved by forming the plate from silicon having high dopant concentrations or from other suitable semiconductors; the conductivities of semiconductor plate 23 can be 0.1 or 1.00 mho/cm or greater. The high conductivity of semiconductor plate 23 enables a large electromagnetic field to be established between first and second parallel plate electrodes respectively formed by plate 23 and electrode 33. The electromagnetic field between plate 23 and electrode 33 has sufficient power to ionize the gas in the volume between the semiconductor plate and workpiece 36 to a plasma with a sufficient number of charge particles to provide efficient, uniform etching of the workpiece. This is in contrast with the Collins et al. references wherein the maximum conductivity of the semiconductor window is 0.03 mho/cm, i.e., a resistivity of 30 ohm-cm. In Collins et al., the RF electromagnetic field generated by the semiconductor window is sufficient only to provide polymerization and fluorine scavenging.

The high conductivity of semiconductor plate 23 in the present invention is possible because of the geometry, i.e., position and arrangement, of metal plate 21, semiconductor plate 23 and coil 36. These elements are arranged so there are: (1) no substantial electric field components coupled from coil 36 to semi-conductor plate 23, and (2) substantial electric and magnetic field components coupled from coil 36 to the gas in chamber 10. The electric and magnetic field components of the electromagnetic field that coil 36 generates are coupled to the gas in chamber 10 to form and maintain the plasma. Because metal plate 21 and semiconductor plate 23 are non-magnetic, the magnetic field components of the electromagnetic field that coil 19 generates is coupled to the gas in the chamber 10 to maintain the plasma. The electric field component that coil 19 generates is coupled to the gas in chamber 10 from the turns of the coil that are beyond the periphery of metal plate 21, that functions as an electrostatic shield to decouple the coil electric field components from semiconductor plate 23.

Figure 1B:
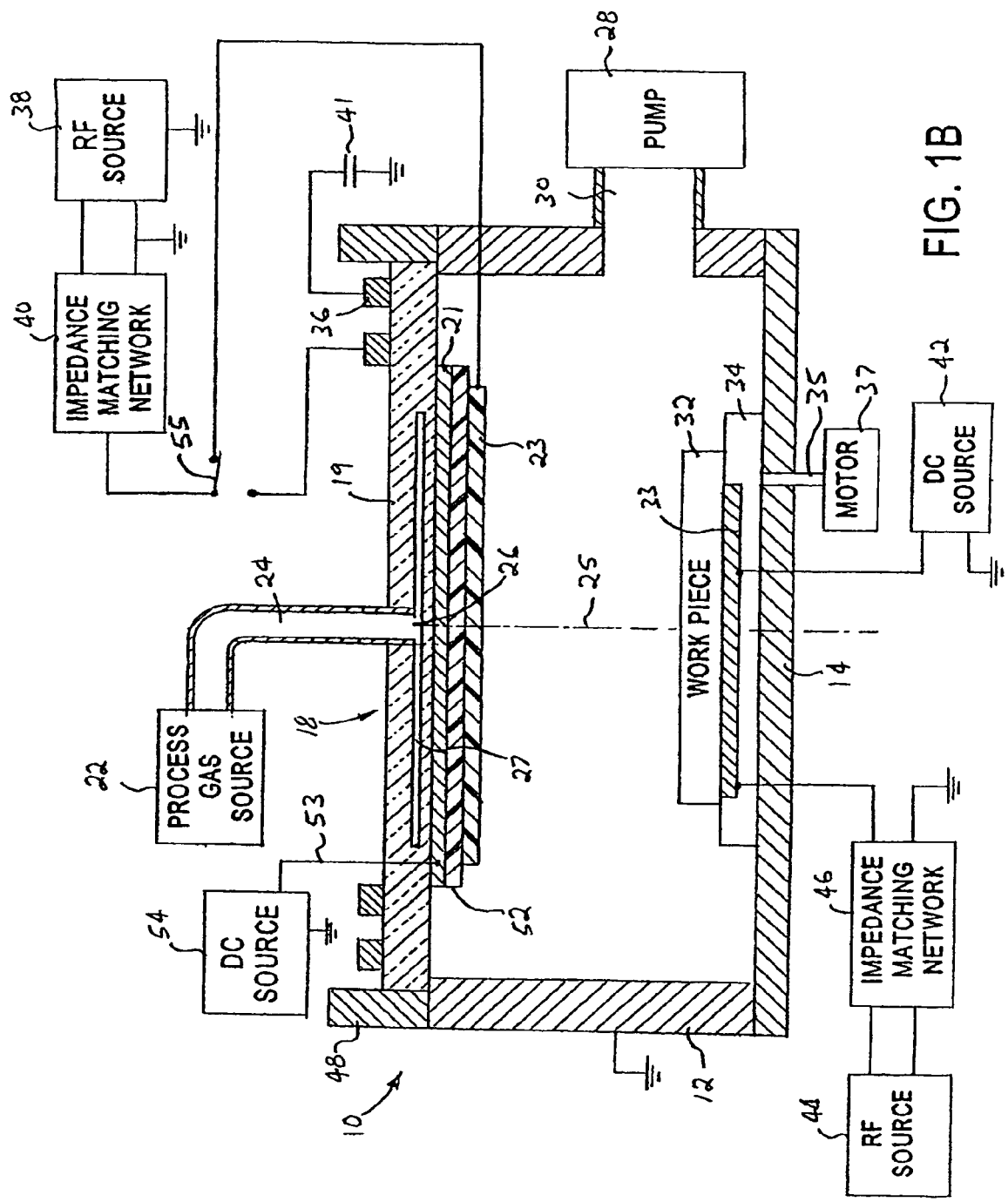
FIG. 1B is a partially schematic diagram including a side sectional view of a vacuum plasma processing chamber including a coil and electrode arrangement in accordance with another embodiment of the present invention.

In accordance with another embodiment illustrated in FIG. 1B, the chamber of FIG. 1A is modified so an RF voltage is applied to semiconductor plate 23, a different voltage is applied to metal plate 21, and dielectric, electric insulating layer 52 is positioned between plates 21 and 23. In particular, lead 53 connects metal plate 21 to DC source 54 or to ground or to an AC source that can be a radio frequency source. If lead 53 applies DC or AC voltage to metal plate 21, the voltage helps to substantially prevent material in chamber 10 from being deposited on the bottom face of window 19 below the turns of coil 36 to keep the window clean. Keeping window 19 clean is important when chamber 10 operates in the inductive mode to assure coupling of the electromagnetic field from coil 36 to the chamber interior. When chamber 10 is operated in the inductive mode, the application of RF power to metal plate 21 helps to ignite the gas in chamber 10 into an RF plasma and to stabilize the RF plasma after ignition, as described in commonly-assigned WO99/34399.

When chamber 10 is operated in the capacitive mode, RF source 38 and matching network 40 drive semiconductor plate 23 to the exclusion of coil 36; when chamber 10 is operated in the inductive mode, source 38 and network 40 drive coil 36 to the exclusion of plate 23. To these ends, the power output terminal of network 40 is selectively coupled via switch 54 to semiconductor plate 23 or coil 36. In the embodiment of FIG. 1B, RF sources 38 and 44 generate different frequencies, respectively 27 MHz and 2 MHz in the preferred embodiment.

Figure 2:
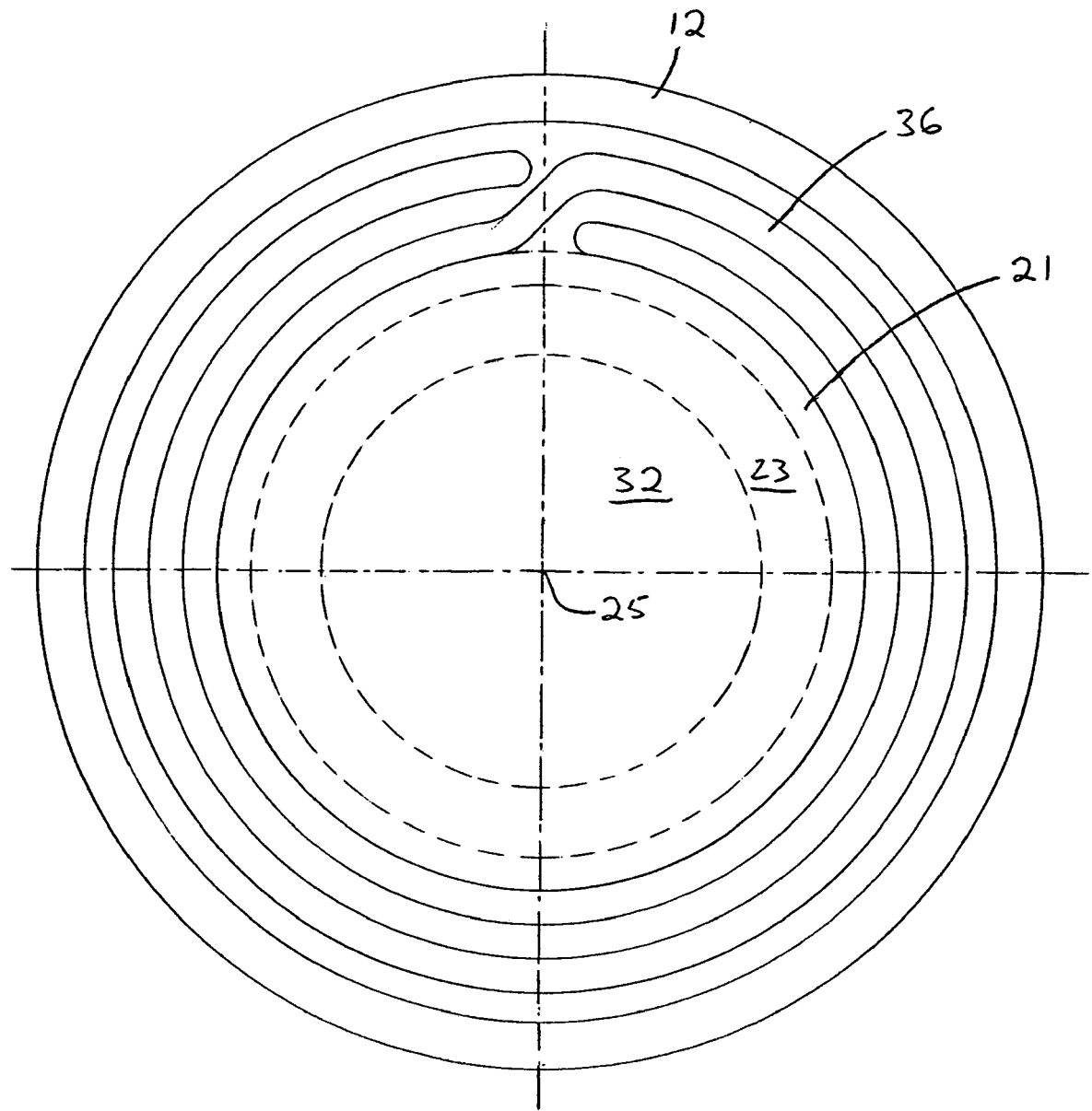
FIG. 2 is a top view of some of the elements included in the chamber of FIGS. 1A and 1B.

In the embodiment of FIGS. 1A, 1B and 2, the foregoing results are achieved because the innermost turn of two turn coil 36 has a periphery substantially aligned with the periphery of metal plate 21 and because the periphery of semiconductor plate 23 is inside the periphery of metal plate 23. As illustrated in FIG. 2, the turns of coil 36 are concentric circles that are connected by a radial and circumferentially extending straight metal coil segment. The innermost turn of coil 36 has a diameter substantially equal to the diameter of metal plate 21, which in turn has a diameter greater than the diameter of semiconductor plate 23. (For clarity, FIG. 2 includes wall 12, plates 21 and 23, workpiece 32 and coil 36 to provide an illustration of the relative sizes of one embodiment of these structures; FIG. 2, however, does not include dielectric window 19, shield 48, chuck 34 or base 14.) As a result of this geometry, metal plate 21 prevents substantial coupling of the electric field component from coil 36 to semiconductor plate 23, so the semiconductor plate, even though it has a high conductivity, does not dissipate substantial power resulting from the electric field component of the electromagnetic field that coil 36 generates. The electric field component of coil 36 and the power dissipation resulting from the electric field component that coil 36 generates are confined primarily to the gas in chamber 10 and are not coupled substantially to semiconductor plate 23, as indicated by the plots of FIGS. 3 and 4.

Figure 3:
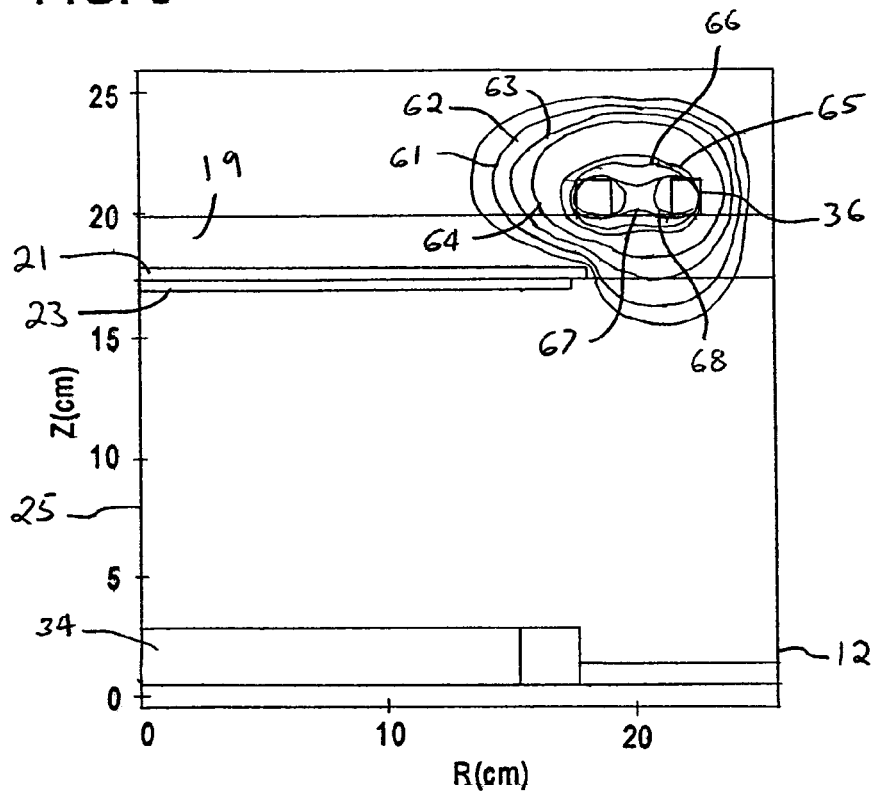
FIG. 3 is a plot of electric field distribution in one-half of the chamber illustrated in FIGS. 1A and 2.
Figure 4:
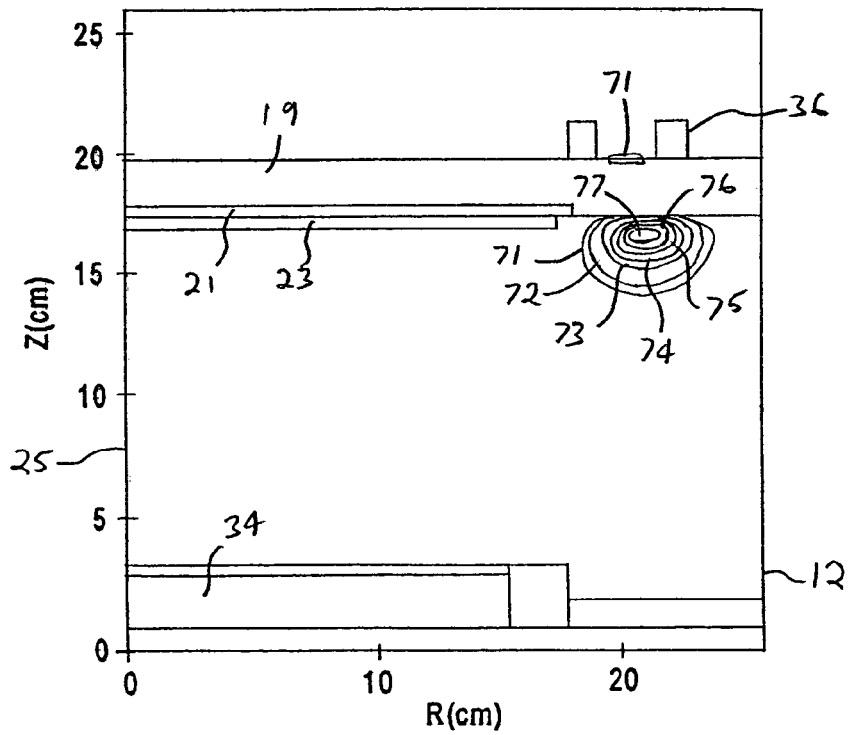
FIG. 4 is a plot of power distribution in one-half of the chamber illustrated in FIGS. 1A and 2.
Figure 5:
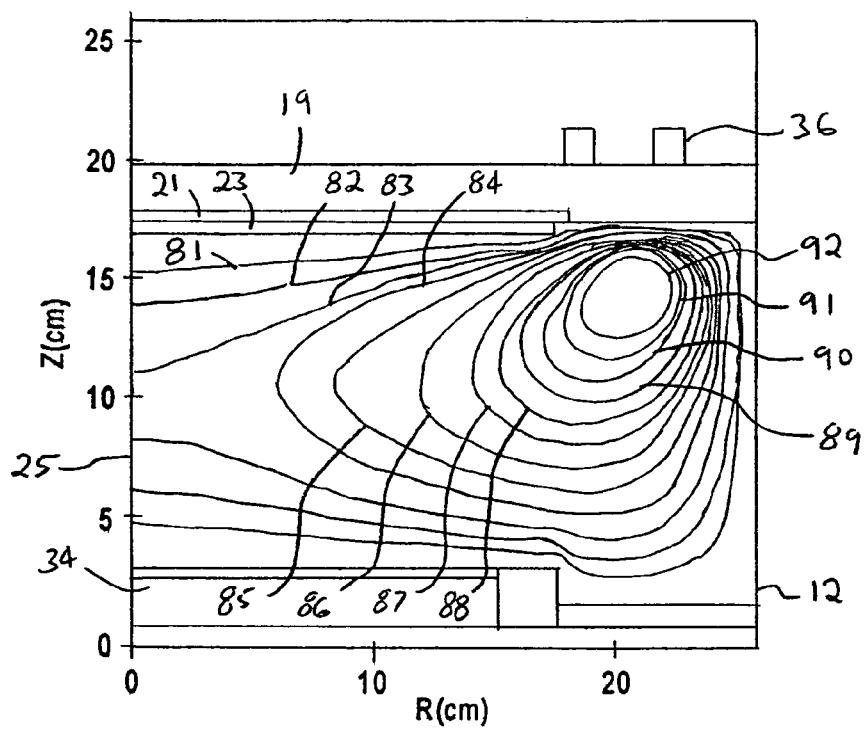
FIG. 5 is a plot of electron density distribution in one-half of the chamber of FIGS. 1A and 2.

The plots of FIGS. 3–5, as well as the plots of FIGS. 7–9, 11–13, 15–17 and 19–24, are based on the same parameters for the operation of chamber 10. These plots are based on 500 watts at 13.56 MHz being supplied to coil 36, a chamber pressure of 10 millitorr, and a nitrogen flow rate of 100 sccm into chamber 10. The parameters of chamber 10 for the foregoing plots are such that the interior diameter of wall 12 is 21" (53 cms), the gap between the lower face of window 19 and the upper face of chuck 34 is 5⅛" (13 cms), window 19 is a silicon carbide plate having a thickness of 1" (2.54 cms), semiconductor plate 23 has a 14" (35.5 cms) diameter and an electrical conductivity of 0.01 mho/cm, and workpiece 32 is a 12" (30.5 cm) silicon wafer. The results indicated by the plots of FIGS. 3–5, 7–9, 11–13, 15–17 and 19–24 are similar to those for semiconductor plates 23 having conductivities of 0.1 and 1.0 mho/cm. Because these plots are for symmetrical distributions, the plots are for one-half of chamber 10, from axis 25 to the interior surface of wall 12.

FIG. 3 is a plot of electric field contours such that lowest electric field contour 61 represents electric fields less than 6.6 volts/cm, while the highest electric field contour 68 represents electric fields in excess of 48.9 volts/cm. Thus, the electric field outside contour 61 is less than 6.6 volts/cm, while the electric field inside contour 67 exceeds 48.9 volts/cm. Intermediate contours 62, 63, 64, 65, 66 and 67 are boundaries having maximum values of 9.98, 12.21, 33.27, 36.60, 39.90, and 43.26 volts/cm. The highest electric field contour 68 occurs between the turns of coil 36, while the lowest electric field contour 61 occurs in the portion of chamber 10, remote from coil 36. The lowest electric field contour 61, associated with electric field concentrations of 6.6 volts/cm or less, does not intercept any portion of non-magnetic metal plate 21 or semiconductor plate 23. The electric field values associated with contour 61 are insufficient to excite the gas in chamber 10 to a plasma. In contrast, contours 62 and 63, which extend into the interior of chamber 10, have sufficiently high values to excite the gas in the chamber to a plasma that is maintained by the magnetic field component coil 36 generates.

The plot of FIG. 4 includes power distribution (in watts per cubic centimeter) contours 71–77 which indicate there is (1) virtually no power dissipation in metal plate 21 or semiconductor plate 23 and (2) substantial power dissipation in the interior of chamber 10 immediately below the portion of window 19 aligned with the turns of coil 36. In particular, minimum power contour 71, associated with a power dissipation of less than 0.065 watts/cu cm, exists in most of the interior of chamber 10, including all parts of plates 21 and 23. Contours 72, 73, 74, 75 and 76 respectively associated with maximum power dissipation boundaries of 0.098, 0.16, 0.33, 0.39 and 0.46 watts/cu cm are in chamber 10 immediately below the two turns of coil 36. Contours 72–76 represent significant power dissipation in the gas in chamber 10; this power dissipation causes the gas to be excited to and maintained in the plasma state.

The electron density distribution plot of FIG. 5, which represents the number of charge particles per cubic centimeter in chamber 10, includes contours 81–91, respectively representing electron density contours of $3.36 \times 10^9$, 5.02×

$10^9$, $6.70 \times 10^9$, $8.37 \times 10^9$, $1.17 \times 10^{10}$, $1.24 \times 10^{10}$, $1.67 \times 10^{10}$, $1.84 \times 10^{10}$, $2.01 \times 10^{10}$, $2.18 \times 10^{10}$, and $2.34 \times 10^{10}$ electrons per cubic centimeter. Thus, there is a relatively low number of charge particles outside of contour 81 where a sheath is formed between the plasma in chamber 10 and the chamber boundaries, including the interior surface of wall 12, chuck 34, workpiece 32, window 19, as well as plates 21 and 23. Ions and electrons in the plasma penetrate the sheath to process the workpiece on chuck 34.

Figure 6:
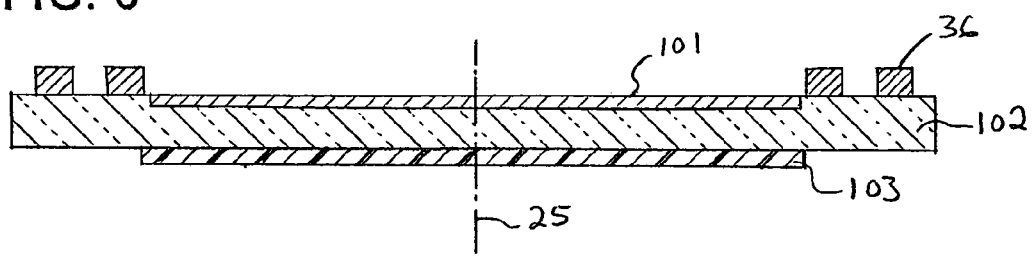
FIG. 6 is a cross-sectional view of a modified roof structure for the chamber of FIG. 1A.

FIG. 6 is a side sectional view of a further embodiment of the invention, wherein the roof structure of FIGS. 1A and 2 is replaced by a roof structure including non-magnetic metal plate or layer 101 and silicon plate 103, respectively mounted on the top and bottom faces of silicon carbide window 102. Metal plate 101 and semiconductor plate 103 are continuous, i.e., have no gaps between the central portions thereof and the peripheries thereof. The interior periphery of the inner turn of two turn coil 36, carried by the upper face of window 102, is (1) spaced slightly outside (about ¼″) the periphery of metal plate 101 and (2) aligned with the periphery of semiconductor plate 103.

Metal layer 101 can be connected to an RF or DC source, or can float when the chamber of FIG. 1A is modified to include the roof structure of FIG. 6 and is operated in the inductive mode. Semiconductor plate 103 can also be supplied with AC or DC power or float when the chamber of FIG. 1A includes the roof structure of FIG. 6 and is operated in the inductive mode. When the chamber of FIG. 1A includes the roof structure of FIG. 6 and the chamber is operated in the capacitive mode, semiconductor plate 103 is either connected to a ground terminal or to a 27 MHz power source.

Figure 7:
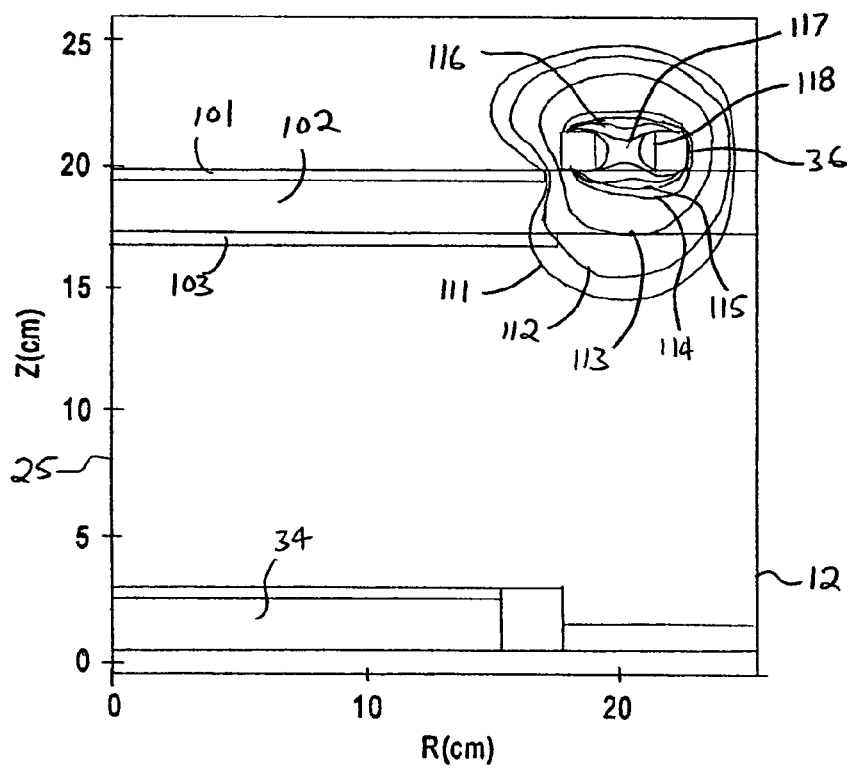
FIG. 7 is a plot of electric field distribution for one-half of the chamber including the roof structure of FIG. 6.

When the chamber of FIG. 1A is modified to include the structure of FIG. 6, the electric field distribution is as illustrated by the plot of FIG. 7. FIG. 7 includes contours 111–118 respectively representing maximum electric field boundaries of 5.18, 7.77, 12.96, 25.92, 28.52, 31.11, 33.70 and 36.30 volts/cm. Contour 112 intercepts the periphery of semiconductor plate 103 to cause power dissipation in the periphery of semiconductor plate 103, as illustrated by the power deposition distribution contours of FIG. 8, which includes power dissipation contours 121, 122, 123, 124, 125, 126 and 127, respectively representing boundaries having maximum power dissipations of 0.044, 0.055, 0.088, 0.22, 0.24, 0.27 and 0.21 watts/cu cm. From FIG. 8, contours 122, 123, 124, 125 and 126 intercept the periphery of semiconductor plate 103. Because of the power dissipation in semiconductor plate 103, less power is available for the gas in chamber 10, so that the roof structure of FIG. 6 is not as desirable as the roof structure of FIGS. 1A, 1B and 2. With the roof structure of FIGS. 1A and 2, the maximum power dissipated in silicon plate 21 is less than 0.065 watts/cu cm, while the roof structure of FIG. 6 results in a maximum power dissipation in semiconductor plate 103 of 0.26 watts/cu cm.

Figure 8:
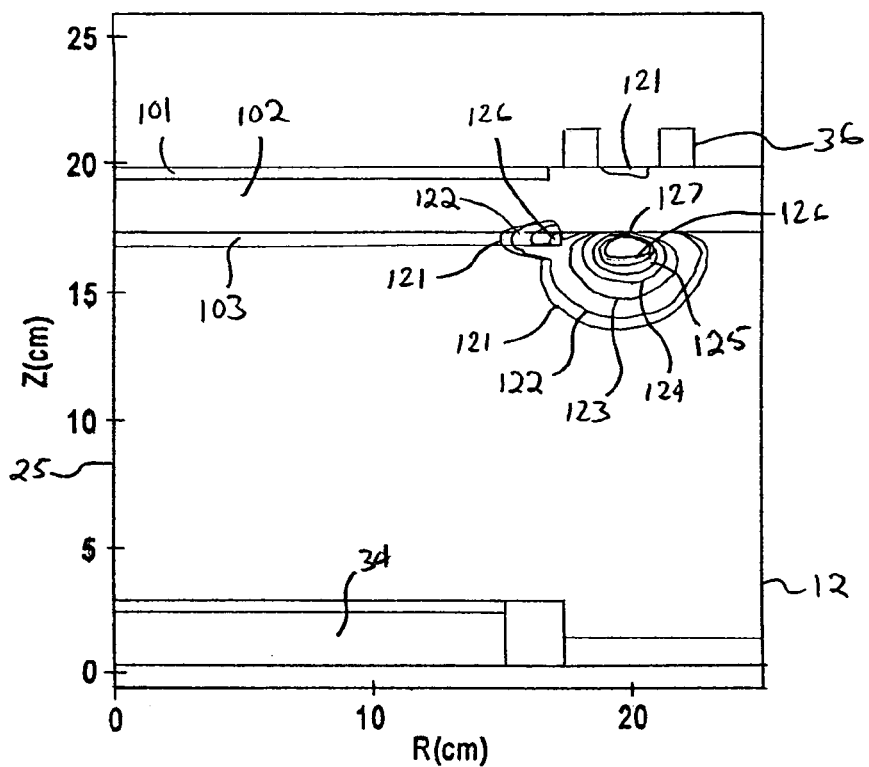
FIG. 8 is a plot of power distribution for one-half of the chamber illustrated in FIG. 6.

FIG. 8 also indicates that the maximum power dissipation in the gas in the chamber of FIG. 1A, when modified to include the roof structure of FIG. 6, is less than for the roof structure of FIGS. 1A and 2. The maximum power dissipation contour in FIG. 8 is 0.31 watts/cu cm, while the maximum power dissipation, as indicated by FIG. 4, for the chamber of FIGS. 1A and 2 is 0.46 watts/cu cm.

Figure 9:
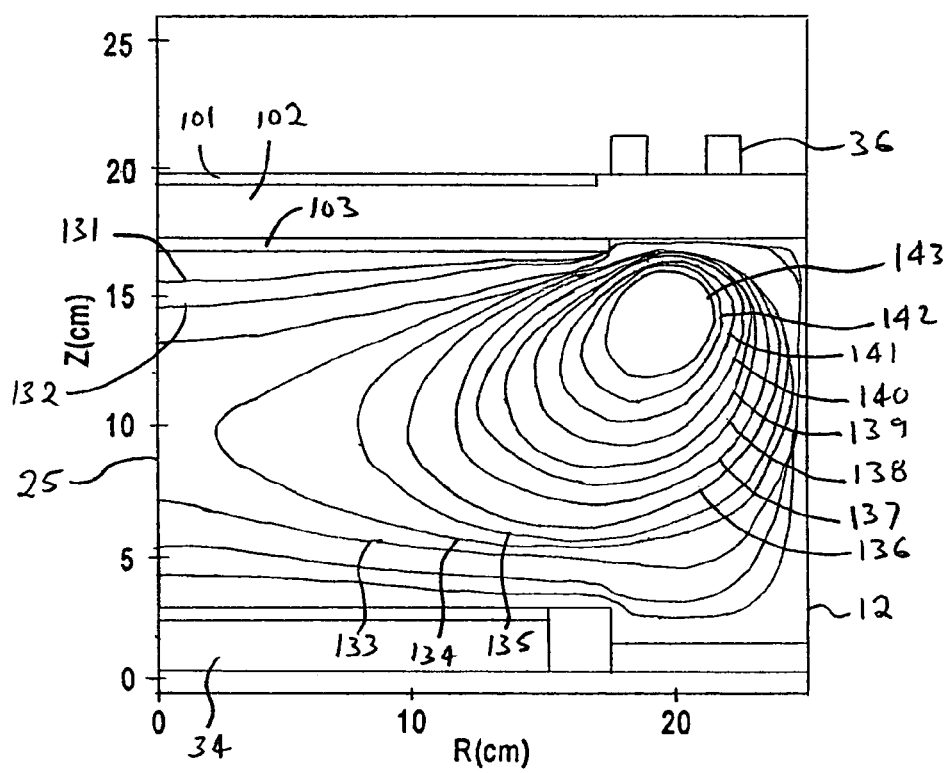
FIG. 9 is a plot of electron density distribution for one-half of the chamber illustrated in FIG. 6.

The electron density distribution plot of FIG. 9 includes contours 131–142, respectively representing maximum boundaries, in numbers of electrons per cubic centimeter, of $2.81 \times 10^9$, $4.22 \times 10^9$, $5.62 \times 10^9$, $7.02 \times 10^9$, $8.43 \times 10^9$, $9.83 \times 10^9$, $1.12 \times 10^{10}$, $1.40 \times 10^{10}$, $1.55 \times 10^{10}$, $1.69 \times 10^{10}$, $1.83 \times 10^{10}$, and $1.97 \times 10^{10}$. The contours of FIG. 9 are for electron density distribution when the roof structure of FIG. 6 replaces the roof structure of FIGS. 1A and 2 in the chamber of FIG. 1A. The shapes of the contours of FIG. 9 are similar to the shapes of the contours of FIG. 5. However, the $2.3 \times 10^{10}$ highest contour 91 of FIG. 5 is substantially greater than the $1.97 \times 10^{10}$ contour 142 of FIG. 9. Hence, the plasma established by the roof structure of FIGS. 1A and 2 is capable of a faster etch rate than the roof structure of FIG. 6 because there are more charge carriers in the plasma of the chamber including the roof structure of FIGS. 1A and 2 than for the roof structure of FIG. 6. However, the overall effect of the roof structure of FIG. 6 is appreciably better than for a roof structure that does not include a shield plate.

Figure 10:
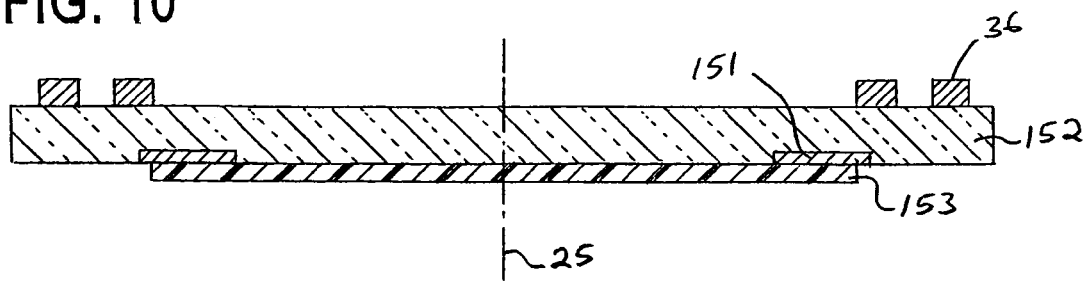
FIG. 10 is a cross-sectional view of a further embodiment of a roof structure for the chamber of FIG. 1A.

According to a further modification illustrated in FIG. 10, the roof structure includes a dielectric window 150 that carries non-magnetic metal ring 151, semiconductor plate 153 and two turn, hollow coil 36. Metal ring 151 is formed as a plate secured to an annular groove on the bottom face of window 152 or is a thin metal coating deposited on the bottom face of the window. Metal ring 151 and semiconductor plate 153, mounted on the lower face of window 152, abut and are arranged and positioned relative to each other and coil 36, mounted on the upper face of window 152, so that (1) the periphery of plate 153 is aligned with the interior periphery of the inner turn of coil 36, (2) the outer periphery of ring 151 extends slightly beyond the periphery of plate 153 and the interior periphery of coil 36, and (3) the inner diameter of ring 151 is less than the diameter of plate 153. In the particular configuration of FIG. 10, metal ring 151 has an inner diameter of 12.4″ (31.5 cm) and an outer diameter of 14.25″ (36.2 cm), so the outer periphery of ring 151 extends ¼″ beyond the periphery of semiconductor plate 153 and the inner periphery of the inner turn of coil 36. Because metal piece 151 and semiconductor plate 153 are in abutting relation, power is supplied to metal ring 151 on the same basis that power is supplied to metal plate 21 in the embodiment of FIGS. 1A and 2.

Figure 11:
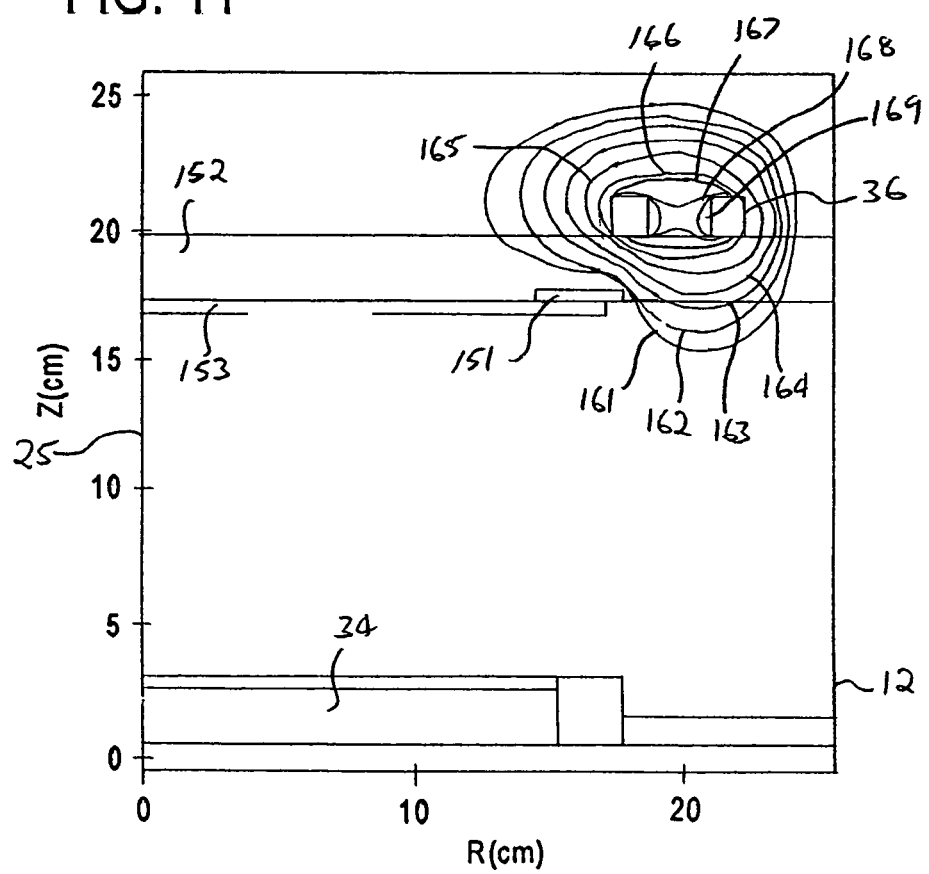
FIG. 11 is a plot of electric field distribution for one-half of the chamber including the roof structure of FIG. 10.
Figure 12:
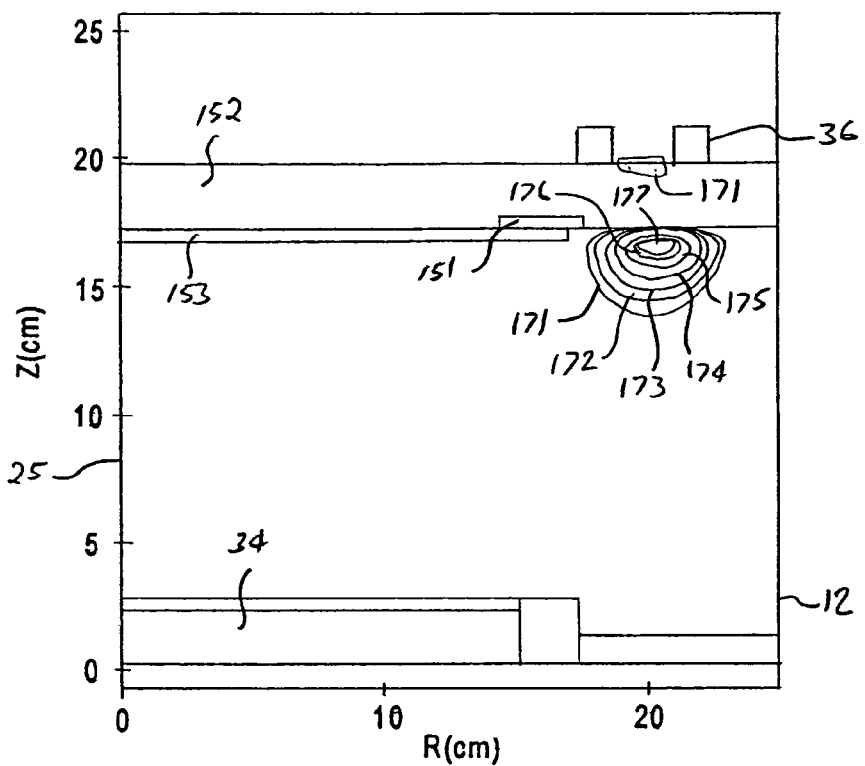
FIG. 12 is a plot of power distribution for one-half of the chamber including the roof structure of FIG. 10.

The electric field and power dissipation distributions plots of FIGS. 11 and 12 indicate no substantial power is dissipated in semiconductor plate 153 when the roof structure of FIG. 10 replaces the roof structure of FIGS. 1A and 2. The electron distribution plot of FIG. 13 indicates the electron density for the roof structure of FIG. 10 and for the roof structure of FIGS. 1A and 2 are virtually the same.

FIG. 11 includes maximum electric field contours 161, 162, 163, 164, 165, 166, 167, 168 and 169, respectively representing electric fields of 6.57, 9.86, 13.1, 16.4, 32.86, 36.14, 39.43, 42.71 and 46.00 volts/cm. All of metal ring 151 and semiconductor plate 153 are in the lowest electric field contour 161. There is very little difference between the electric field contours of FIGS. 3 and 11.

Figure 13:
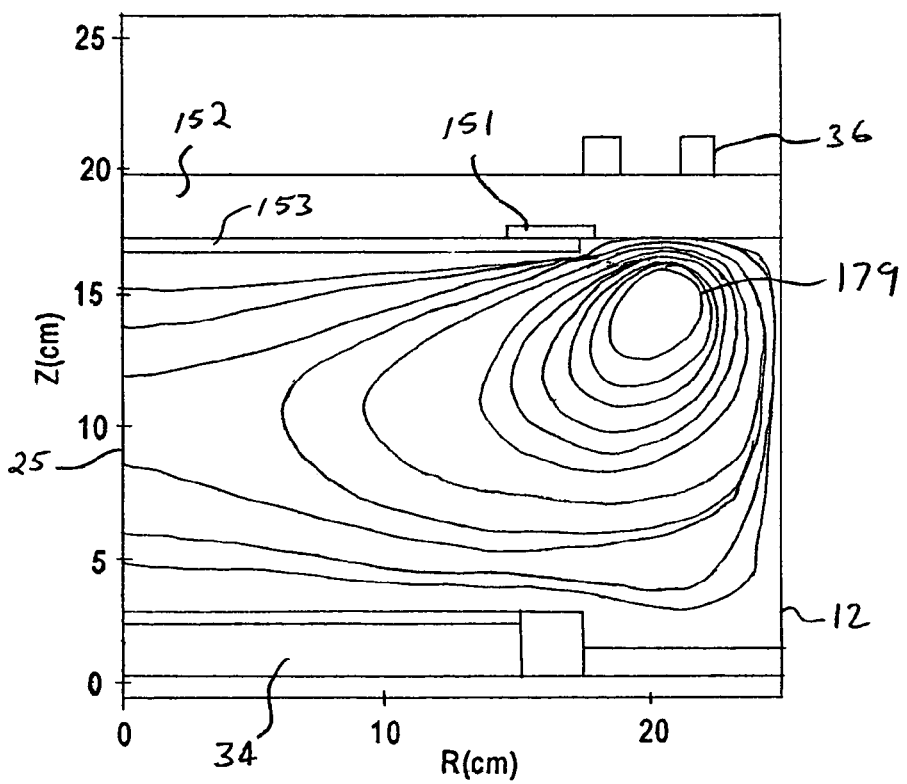
FIG. 13 is a plot of electron density distribution for one-half of the chamber including the roof structure of FIG. 10.

FIG. 12 includes maximum power contours 171, 172, 173, 174, 175, 176 and 177, respectively representing powers of 0.064, 0.096, 0.13, 0.16, 0.32, 0.38 and 0.45 watts/cu cm. From FIG. 12, there is no power dissipation in metal ring 151 or semiconductor plate 153 in excess of 0.064 watts/cu cm. The 0.45 watts/cu cm maximum power dissipation contour 177 is very similar to the maximum power dissipation in FIG. 4 of 0.46 watts/cu cm. It thus follows that the $2.2 \times 10^{10}$ watts/cu cm maximum electron density contour 179 of FIG. 13 is very similar to the maximum electron particle distribution of $2.34 \times 10^{10}$ of FIG. 10.

Figure 14:
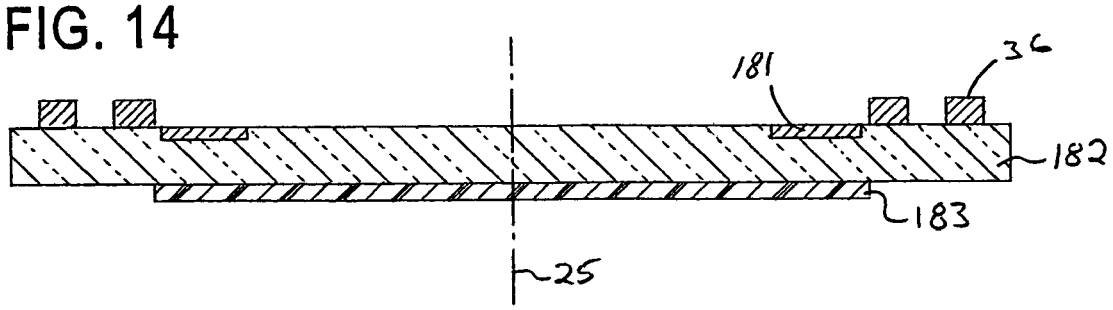
FIG. 14 is a cross-sectional view of a further roof structure for the chamber of FIG. 1A.

According to a further embodiment of the invention, as illustrated in FIG. 14, the roof structure of FIGS. 1A and 2 is replaced by a roof structure including non-magnetic metal ring 181 that sits on the upper surface of dielectric window 182, which carries semiconductor plate 183 on its lower surface. The upper face of window 182 carries coil 36, the inner periphery of which is slightly outside the periphery of ring 181. The outer diameter of metal ring 181 and the diameter of semiconductor plate 183 are the same, i.e., 14", and metal ring 181 has an inner diameter of 13". Metal ring 181 and semiconductor plate 183 of FIG. 14 are energized in the same manner described supra in connection with the metal layer 101 and semiconductor plate 103 of FIG. 6.

Figure 15:
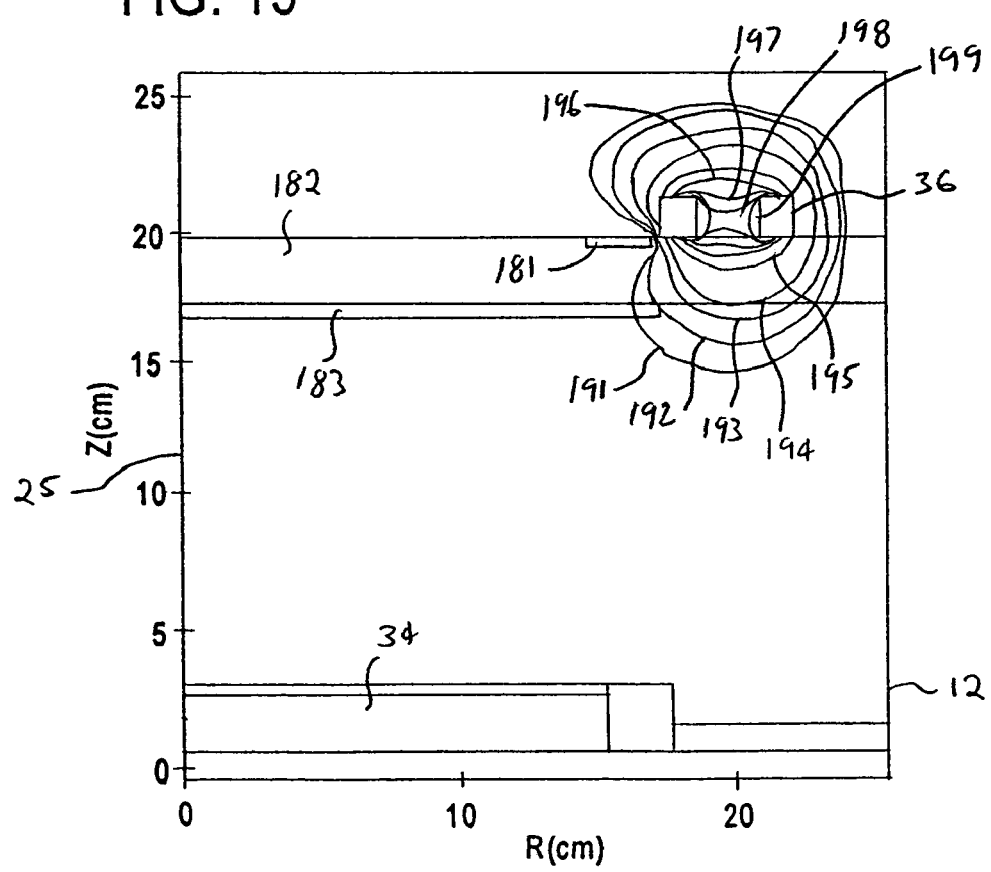
FIG. 15 is a plot of electric field distribution for one-half of the chamber including the roof structure of FIG. 14.
Figure 16:
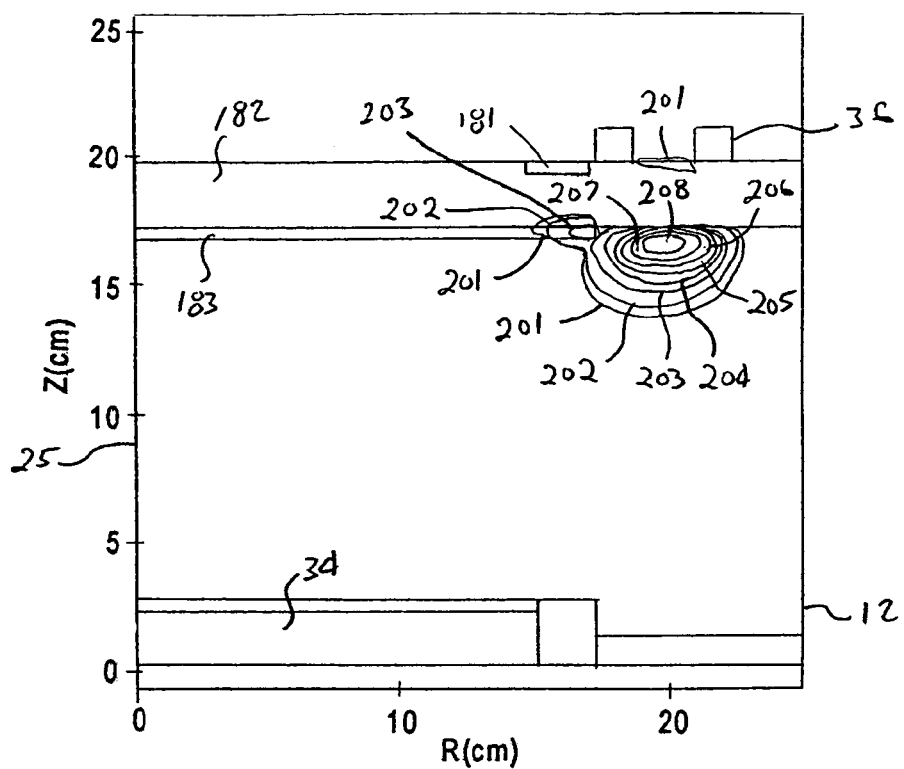
FIG. 16 is a plot of power distribution for one-half of the chamber including the roof structure of FIG. 14.

FIGS. 15 and 16 are plots of the electric field and power dissipation contours when the roof structure of FIG. 14 replaces the roof structure of FIGS. 1A and 2. The plots of FIGS. 15 and 16 are very similar to the plots of FIGS. 7 and 8, respectively. FIG. 15 includes maximum electric field contours 191, 192, 193, 194, 195, 196, 197, 198 and 199, respectively associated with electric field values of 5.43, 8.15, 10.86, 13.58, 27.16, 29.88, 32.59, 35.31 and 38.03 volts/cm. Contours 191 and 192 intercept the periphery of semiconductor plate 183, causing power dissipation in the periphery of plate 183, as indicated by maximum power contours 201, 202, 203, 204 and 205 (FIG. 16), respectively associated with power dissipations of 0.045, 0.068, 0.09, 0.11 and 0.23 watts/cu cm. The highest maximum power dissipation contour 208 in the plot of FIG. 16 is associated with a power dissipation of 0.32 watts/cu cm.

Figure 17:
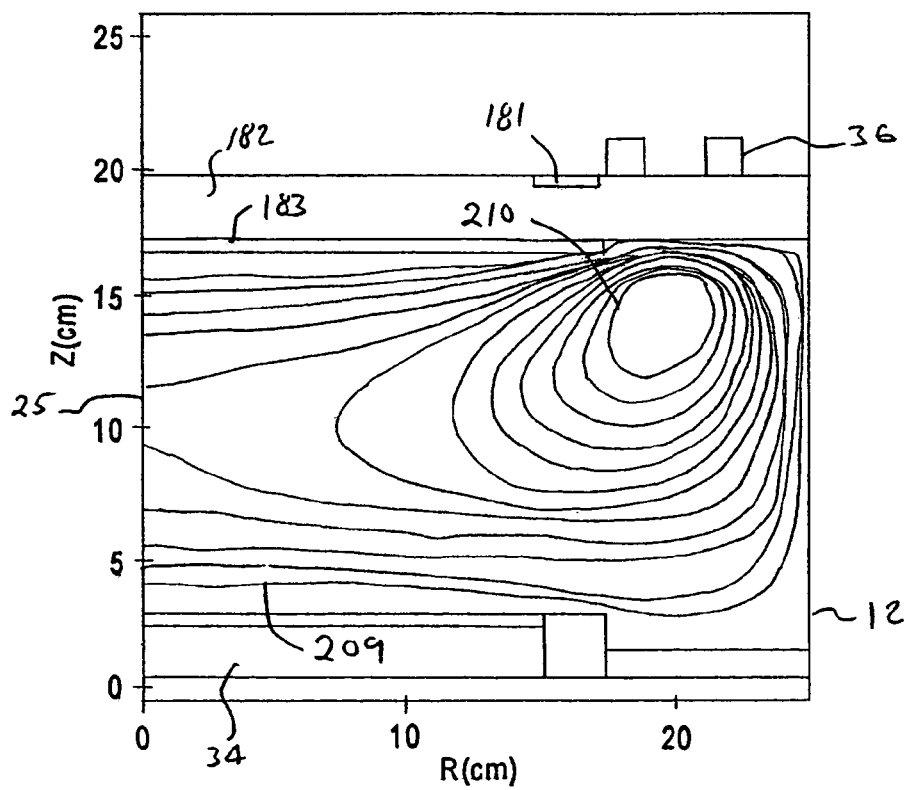
FIG. 17 is a plot of electron density distribution for one-half of the chamber including the roof structure of FIG. 14.

The roof structure of FIG. 14 results in the maximum electron density contours of FIG. 17. The minimum and maximum electron density contours 209 and 210 of FIG. 17 respectively represent electron densities of $2.72 \times 10^9$ and $1.90 \times 10^{10}$ electrons/cu cm.

Figure 18:
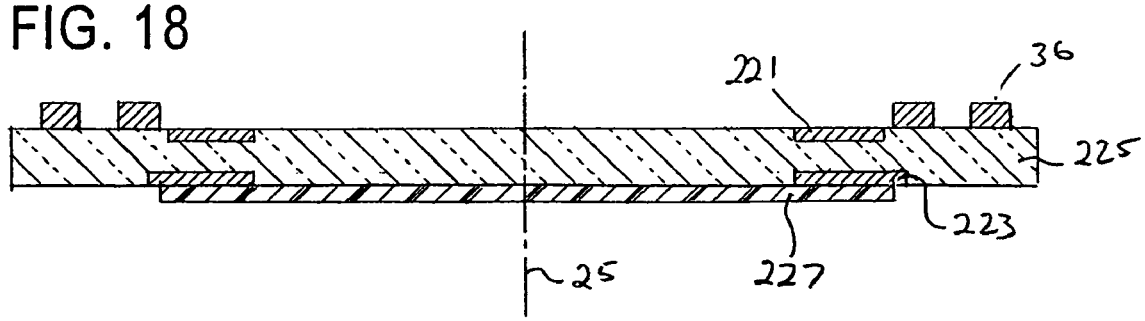
FIG. 18 is a cross-sectional view of an additional roof structure for the chamber of FIG. 1A.

According to a further embodiment of the invention, illustrated in FIG. 18, the roof structure of FIGS. 1A and 2 is modified to include non-magnetic metal rings 221 and 223 respectively carried on the upper and lower faces of dielectric window of 225, which also carries semiconductor plate 227 and coil 36. Metal ring 223, semiconductor plate 227 and coil 36 are respectively configured in the same manner as metal ring 151, semiconductor plate 153 and coil 36 in the embodiment of FIG. 10. Metal ring 221, on the top face of dielectric window 225 is configured in the same way as metal ring 181, in the embodiment of FIG. 14. Metal rings 181 and 221 can be grounded, powered or float, as desired.

Figure 19:
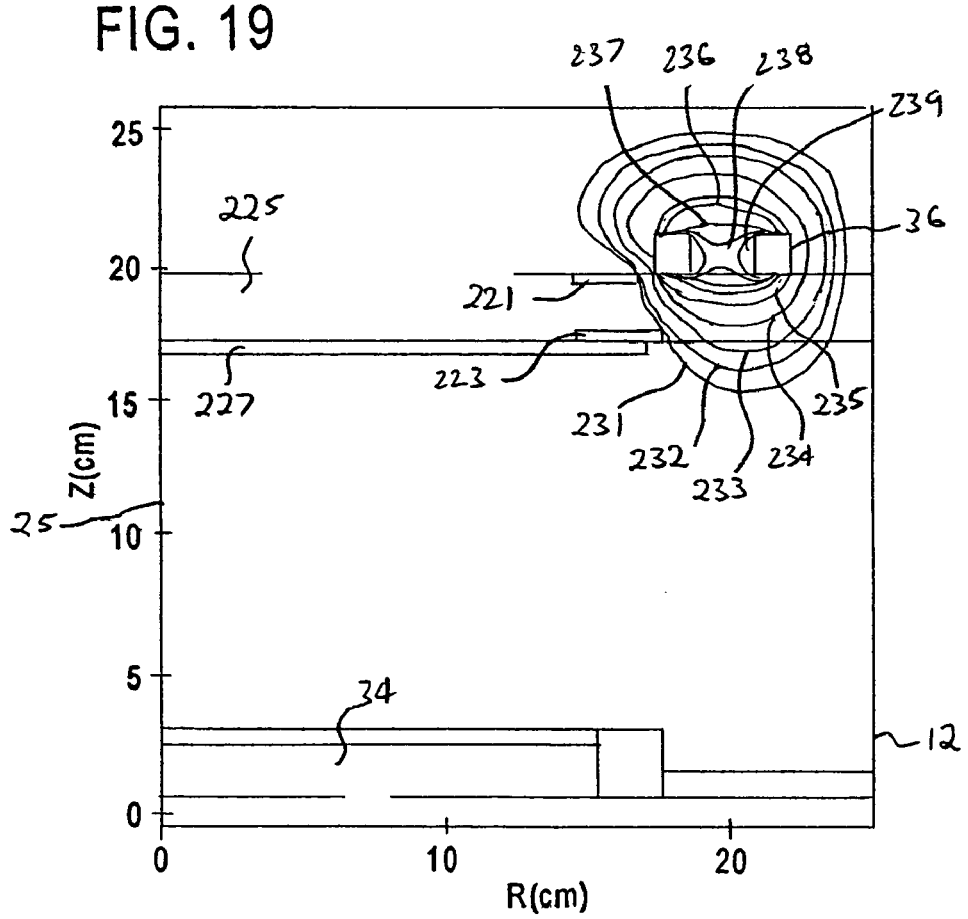
FIG. 19 is a plot of electric field distribution for one-half of the chamber including the roof structure of FIG. 18.
Figure 20:
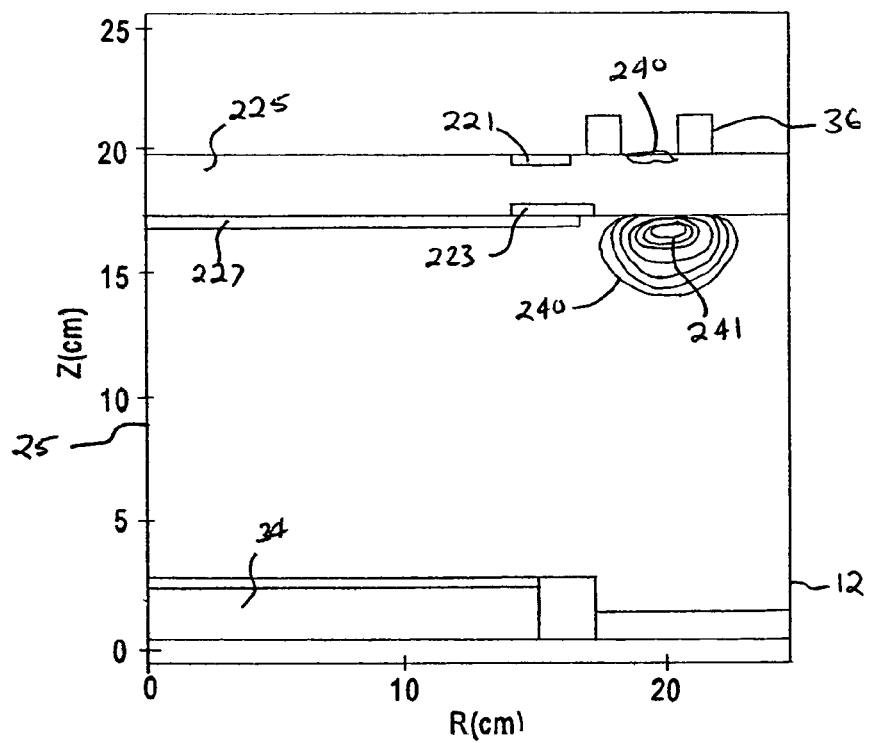
FIG. 20 is a plot of power distribution for one-half of the chamber including the roof structure of FIG. 18.
Figure 21:
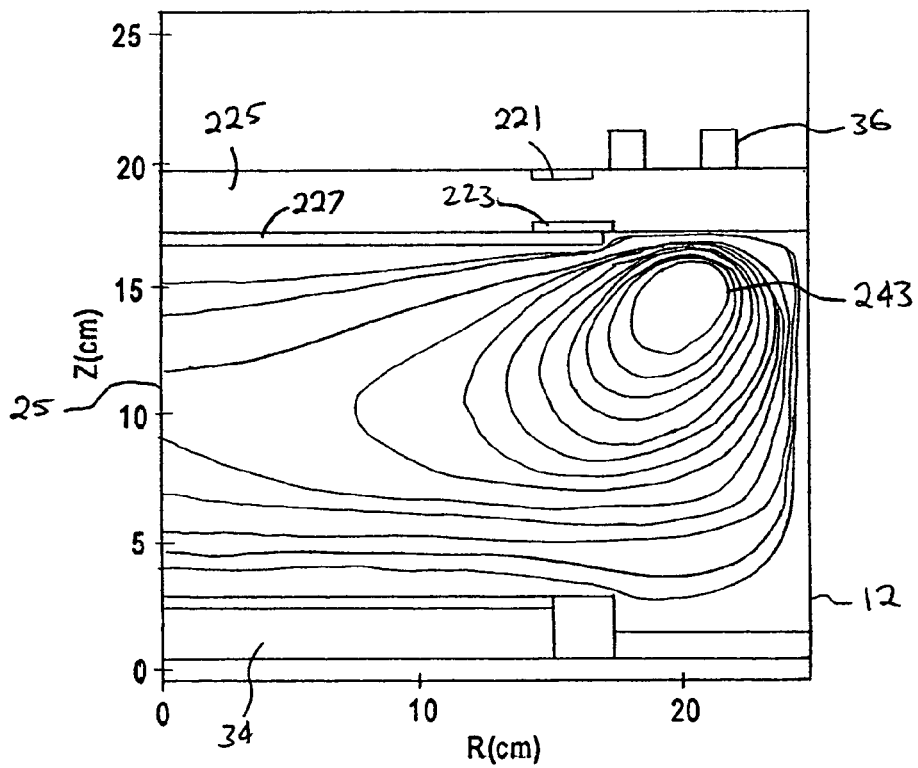
FIG. 21 is a plot of electron density distribution for one-half of the chamber including the roof structure of FIG. 18.

The roof structure of FIG. 18 provides optimum results as seen from the plots of FIGS. 19, 20 and 21. Maximum electric field contours 231, 232, 233, 234, 235, 236, 237, 238 and 239 of FIG. 19, respectively have values of 6.91, 10.4, 13.8, 17.2, 34.55, 38.0, 41.4, 44.9 and 48.37 volts/cm. All of semiconductor plate 227 is within contour 231. Consequently, as indicated by FIG. 20, the power dissipation in semiconductor plate 227 is less than 0.67 watts/cu cm, the value associated with contour 240 and the maximum power dissipation in the gas in chamber 10 exceeds the 0.49 watts/cu cm. of contour 241. The electron density contours of FIG. 21 indicate that the maximum electron density resulting from the roof structure of FIG. 18 replacing the roof structure of FIGS. 1A and 2 is in excess of $2.32 \times 10^{10}$ charges per cubic centimeter indicated by contour 243.

Figure 24:
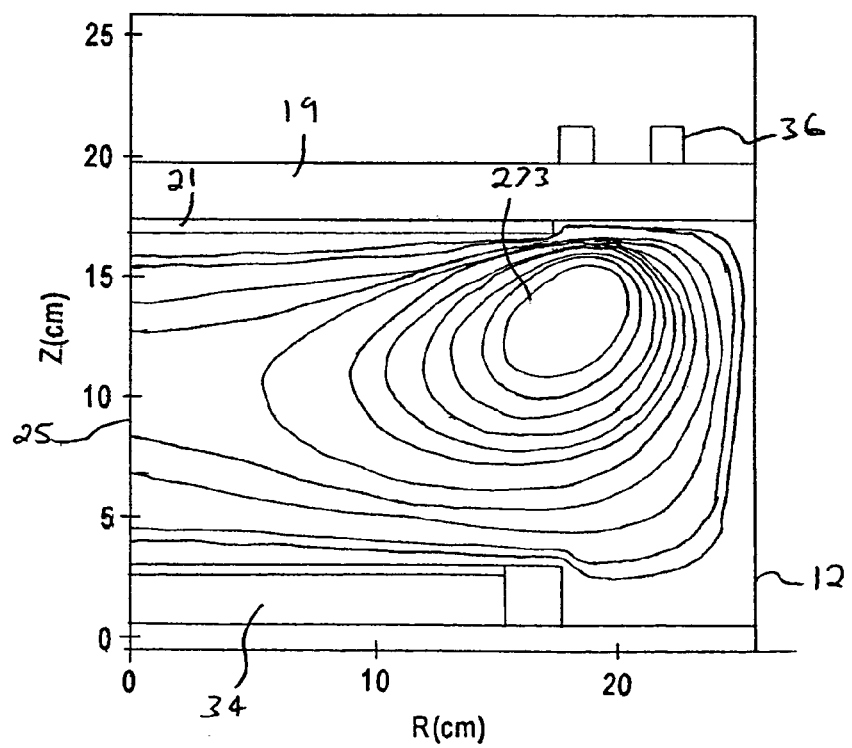
FIG. 24 is a plot of electron density distribution for one-half of the chamber of FIG. 1A under the same circumstances as for the plot of FIG. 22.
Figure 22:
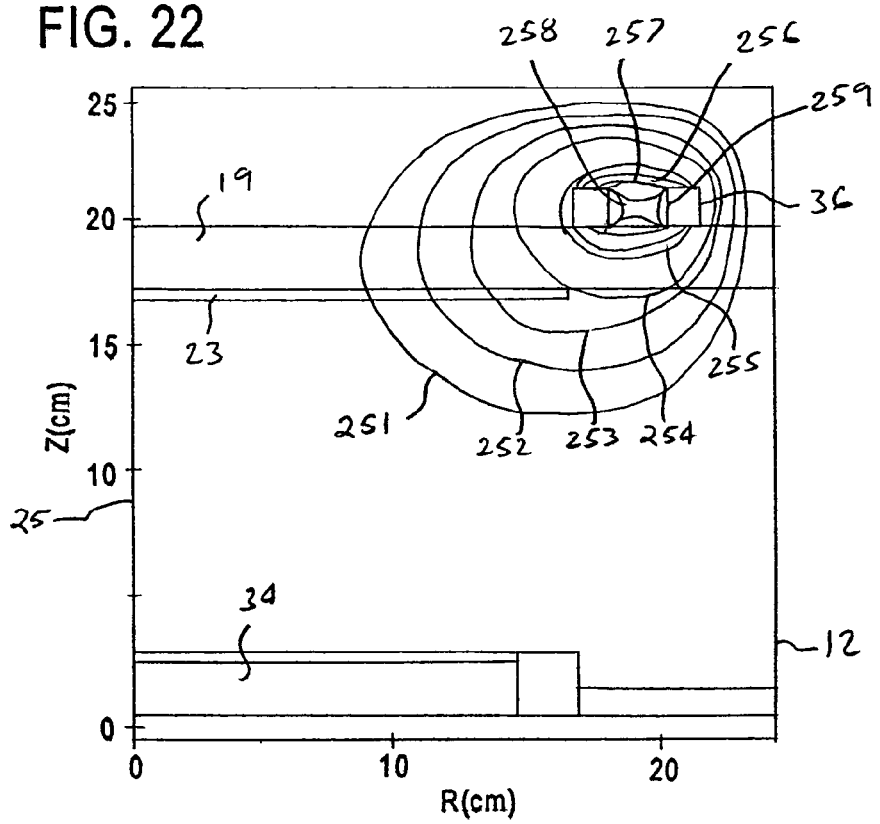
FIG. 22 is a plot of electric field distribution for one-half of the chamber of FIG. 1A, when the chamber does not include a non-magnetic metal shield plate between a semiconductor electrode and a coil.
Figure 23:
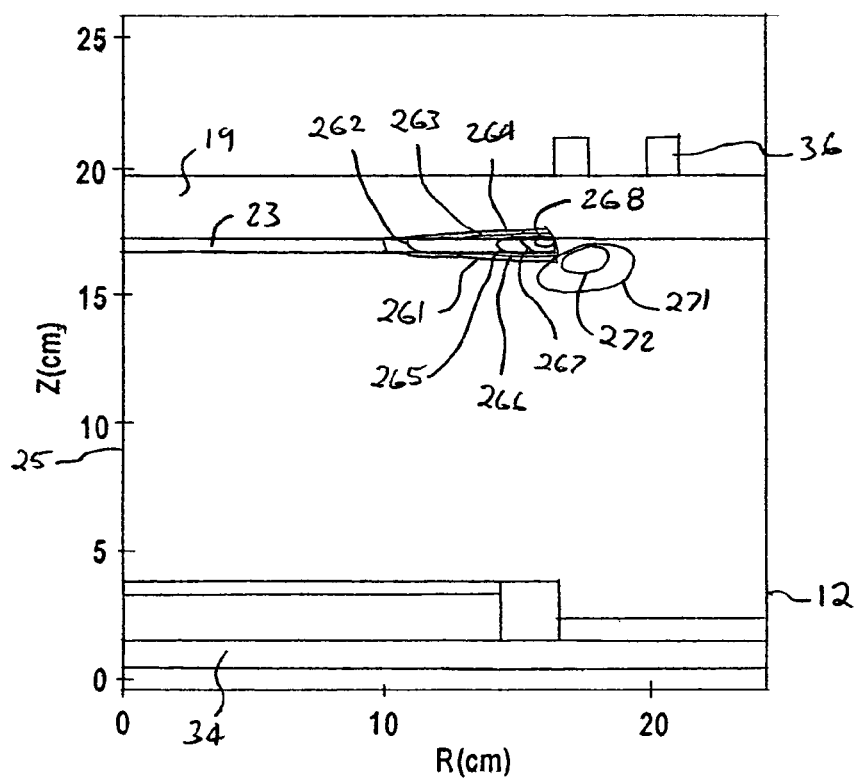
FIG. 23 is a plot of power distribution for one-half of the chamber of FIG. 1A under the same circumstances as for the plot of FIG. 22.

The results achieved by the present invention are to be contrasted to the situation wherein no electric shield plate is interposed between coil 36 and semiconductor plate 23. FIGS. 22, 23 and 24 are respectively plots of the electric field, power dissipation and electron density distribution for such a situation.

FIG. 22 includes maximum electric field contours 251, 252, 253, 254, 255, 256, 257, 258 and 259, respectively associated with electric fields of 3.33, 4.99, 6.56. 9.32, 16.64, 18.30, 19.96, 21.83 and 23.3 volts/cm. Contours 251–254 intercept substantial portions of semiconductor plate 23, such that contour 251 is approximately 2" (10 cm) from the center of semiconductor plate 23. Consequently, there is an appreciable electric field distribution in almost 70% of the area of semiconductor plate 23 and almost all the power that coil 36 couples into dielectric window 19 and into chamber 10 is dissipated in semiconductor plate 23, as illustrated by contours 261, 262, 263, 264, 265, 267 and 268 of FIG. 23. The power dissipation occurs in approximately the same portion of semiconductor plate 23 as the portion of the plate which is coupled to the electric fields associated with contours 251–254. Contours 261, 262, 263, 264, 265, 267 and 268 are respectively associated with power dissipations of 0.079, 0.12, 0.16, 0.19, 0.39, 0.48 and 0.57 watts/cu cm. Contours 271 and 272, respectively associated with power dissipations of 0.79 and 0.12 watts/cu cm, are the only appreciably sized power dissipation contours in the gas in chamber 10 when the chamber does not include a non-magnetic metal shield plate, as in the embodiments of FIGS. 1A, 1B, 2, 6, 10, 14 or 18. Consequently, without the shield plate, the electron density distribution in chamber 10 is quite low, as indicated by the contours of FIG. 24. The highest maximum electron density distribution contour 273 in FIG. 24 has a value of $9.39 \times 10^9$ electrons/cu cm, while the lowest contour 274 is associated with an electron density of $1.34 \times 10^9$ electrons/cu cm. Hence, the highest maximum electron density contour 273 of FIG. 24 is less than one-half of the highest maximum electron density contour of FIG. 21.

While there have been described and illustrated specific embodiments of the invention, it will be clear that variations in the details of the embodiments specifically illustrated and described may be made without departing from the true spirit and scope of the invention as defined in the appended claims.

What is claimed is:

1. A method of removing material from a workpiece in a vacuum plasma processing chamber including first and second spaced plasma excitation electrodes, one of which includes a semiconductor interposed between a magnetic field that can be derived by a plasma excitation coil and gas in the chamber, comprising removing the material during a first interval by energizing the coil so it supplies an RF ionizing electromagnetic field to the gas, the RF ionizing electromagnetic field having magnetic field components that are coupled through the semiconductor to the gas and electric field components that are coupled to the gas without being diminished by the semiconductor, the electromagnetic field having sufficient power to cause a plasma resulting from the gas to be sufficiently energetic to etch the material, removing the material during a second interval by energizing the electrodes so they capacitively supply an RF ionizing field to the gas, the capacitively supplied RF ionizing field being coupled between the electrodes to the gas and material.

2. The method of claim 1 wherein the material includes a dielectric layer that is etched during the second interval.

3. The method of claim 1 wherein the material includes an underlayer that is etched during the second interval.

4. The method of claim 1 wherein the method includes a photoresist layer that is etched during the second interval.

5. The method of claim 1 wherein the method includes a photoresist that is stripped from the workpiece during the first interval.

6. The method of claim 1 further including maintaining the chamber in a vacuum state between the first and second intervals.

7. The method of claim 6 further including cleaning the chamber during a third interval by energizing the coil so it supplies an RF ionizing electromagnetic field to the gas, the RF ionizing electromagnetic field derived during the third interval having magnetic field components that are coupled through the semiconductor to the gas and electric field components that are coupled to the gas without being diminished by the semiconductor, the electromagnetic field derived during the third interval having sufficient power to cause a plasma resulting from the gas to be sufficiently energetic to etch material deposited on interior surfaces of the chamber, and maintaining the chamber in the vacuum state during the third interval, and between the first and third intervals, and between second and third intervals.

* * * * *